(12) United States Patent
Shinohara

(10) Patent No.: US 10,527,841 B2
(45) Date of Patent: Jan. 7, 2020

(54) ELECTRO-OPTIC DEVICE, ELECTRONIC APPARATUS, AND METHOD OF MANUFACTURING ELECTRO-OPTIC DEVICE

(71) Applicant: SEIKO EPSON CORPORATION, Tokyo (JP)

(72) Inventor: Takashi Shinohara, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 24 days.

(21) Appl. No.: 15/466,057

(22) Filed: Mar. 22, 2017

(65) Prior Publication Data
US 2017/0285328 A1    Oct. 5, 2017

(30) Foreign Application Priority Data
Mar. 29, 2016    (JP) ................. 2016-065207

(51) Int. Cl.
| | | |
|---|---|---|
| G02B 26/00 | (2006.01) | |
| G02B 26/08 | (2006.01) | |
| B81B 7/00 | (2006.01) | |
| B81C 1/00 | (2006.01) | |
| G03B 21/00 | (2006.01) | |

(52) U.S. Cl.
CPC ........ *G02B 26/0833* (2013.01); *B81B 7/0038* (2013.01); *B81C 1/00285* (2013.01); *B81B 2201/042* (2013.01); *G03B 21/008* (2013.01)

(58) Field of Classification Search
CPC ..... H01L 21/56; H01L 23/24; H01L 23/3121; G02B 26/0833; G02B 7/008
USPC .................................. 359/290–297
See application file for complete search history.

(56) References Cited

U.S. PATENT DOCUMENTS

| | | | |
|---|---|---|---|
| 6,856,014 B1 | 2/2005 | Ehmke et al. | |
| 7,136,216 B1* | 11/2006 | Daniel | G02B 26/004 359/296 |
| 7,217,999 B1* | 5/2007 | Honda | H01L 21/486 257/712 |
| 7,898,724 B2 | 3/2011 | Liu et al. | |
| 2014/0233086 A1* | 8/2014 | Oberst | B81B 7/007 359/291 |
| 2017/0315344 A1* | 11/2017 | Hanaoka | G02B 26/0841 |

FOREIGN PATENT DOCUMENTS

JP    2001-318324 A    11/2001

* cited by examiner

*Primary Examiner* — Mahidere S Sahle
(74) *Attorney, Agent, or Firm* — Oliff PLC

(57) ABSTRACT

In an electro-optic device, a chip provided with a mirror and a drive element adapted to drive the mirror, a cover having a light-transmitting property and adapted to cover the mirror in a planar view, and a spacer located between the cover and the chip are disposed on an interconnection board. Further, a boundary between the cover and the spacer, a boundary between the chip and the spacer, and a part of the interconnection board are covered with an inorganic film such as an aluminum oxide film. The inorganic film also covers a part of a chip-side terminal and an internal terminal, and a conductive member.

12 Claims, 9 Drawing Sheets

ELECTRO-OPTIC DEVICE, ELECTRONIC APPARATUS, AND METHOD OF MANUFACTURING ELECTRO-OPTIC DEVICE

The entire disclosure of Japanese Patent Application No. 2016-065207, filed Mar. 29, 2016 is expressly incorporated by reference herein.

BACKGROUND

1. Technical Field

The present invention relates to an electro-optic device equipped with a mirror, a method of manufacturing the electro-optic device, and an electronic apparatus.

2. Related Art

As an electronic apparatus, there has been known, for example, a projection-type display device, which modulates the light emitted from a light source using a plurality of mirrors (micro mirrors) of an electro-optic device called a digital mirror device (DMD), and then projects the modulated light in an enlarged manner using a projection optical system to thereby display an image on a screen. The electro-optic device used for such a projection-type display device includes, for example, a chip provided with mirrors and a drive element for driving the mirrors, a cover having a light-transmitting property and covering the mirrors in a planar view, and a spacer located between the cover and the chip. In the electro-optic device, if moisture infiltrates in the space where the mirrors are disposed, the mirror is stuck by the moisture attached to the periphery of the mirror in a tilted posture, and there is a possibility that a failure in operation occurs. Therefore, there is proposed a structure of covering side surfaces of the cover and the spacer with sealing resin (see U.S. Pat. No. 7,898,724 (Document 1)).

However, even if sealing is performed as in the configuration described in Document 1, there is a possibility that moisture infiltrates through an interface between the cover and the sealing resin, and such moisture further infiltrates in the space where the mirrors are disposed through an interface between the cover and the spacer.

SUMMARY

An advantage of some aspects of the invention is to provide an electro-optic device, a method of manufacturing the electro-optic device, and an electronic apparatus each capable of effectively preventing moisture from infiltrating in the space where the mirrors are disposed.

An electro-optic device according to an aspect of the invention includes an interconnection board, a chip mounted on one surface of the interconnection board, and provided with a mirror and a drive element adapted to drive the mirror, a cover having a light-transmitting property, and adapted to cover the mirror, a spacer located between the cover and the chip, and an inorganic film adapted to cover a boundary between the cover and the spacer, a boundary between the chip and the spacer, and a part of the interconnection board.

A method of manufacturing an electro-optic device according to an aspect of the invention includes disposing a chip provided with a mirror and a drive element adapted to drive the mirror on one surface of an interconnection board, a cover adapted to cover the mirror, and a spacer located between the cover and the chip, and forming an inorganic film adapted to cover a boundary between the cover and the spacer, and a boundary between the spacer and the chip after disposing the chip.

In the aspects of the invention, the boundary between the cover and the spacer, and the boundary between the chip and the spacer are covered with the inorganic film, and the inorganic film is formed through the deposition process. Therefore, since the adhesiveness between the cover, the spacer, and the chip is high, it is hard for moisture to infiltrate through the interface between the cover and the inorganic film. Therefore, it is possible to effectively prevent the moisture from infiltrating in the space in which the mirror is disposed through the boundary between the cover and the spacer, and the boundary between the chip and the spacer. Therefore, it is hard for the failure that, for example, the mirror is stuck in a tilted posture due to the moisture attached to the periphery of the mirror to occur.

The electro-optic device according to the aspect of the invention may be configured such that the electro-optic device further includes a first terminal disposed on the one surface of the interconnection board, a second terminal electrically connected to the drive element, and provided to the chip, and a conductive member adapted to connect the first terminal and the second terminal to each other, and the inorganic film is an insulating film, and covers the conductive member. In the method of manufacturing the electro-optic device according to such an aspect of the invention, the interconnection board has a first terminal on the one surface, the chip has a second terminal electrically connected to the drive element, the inorganic film is an insulating film, and the method further includes connecting the first terminal and the second terminal to each other with a conductive member after disposing the chip and before forming the inorganic film. According to the electro-optic device related to such an aspect of the invention, the short circuit of the conductive members and so on can be prevented using the inorganic film.

The electro-optic device according to the aspect of the invention may be configured such that the inorganic film covers a part of the first terminal. The method of manufacturing the electro-optic device according to such an aspect of the invention may be configured such that, after forming the inorganic film, the inorganic film covers the conductive member.

The electro-optic device according to the aspect of the invention may be configured to further include an adhesive layer made of an adhesive including a hydroxyl group (an OH group) disposed on the boundary between the spacer and the cover. In the case in which the adhesive layer disposed on the boundary between the cover and the spacer includes the hydroxyl group (the OH group), the chemical reaction due to the atomic layer deposition method promptly progresses on the adhesive layer, and the adhesiveness between the adhesive layer and the inorganic film is improved. Therefore, it is possible to suppress the deterioration of the mirror.

The method of manufacturing the electro-optic device according to the aspect of the invention may be configured such that the forming of the inorganic film includes depositing the inorganic film so as to cover the cover, and removing the inorganic film overlapping an outer surface of the cover as a surface located on an opposite side to the mirror after depositing the inorganic film.

In this case, the method of manufacturing the electro-optic device may be configured such that, in depositing the inorganic film, the inorganic film is deposited in a state of covering the outer surface with a protective member, and in removing the inorganic film, the protective member is removed from the outer surface.

In the method of manufacturing the electro-optic device according to the aspect of the invention, it is preferable that, in forming the inorganic film, the inorganic film is deposited using an atomic layer deposition method. According to the atomic layer deposition method, since this method is superior in coatability for an uneven shape, the boundary between the cover and the spacer and the boundary between the chip and the spacer can reliably be covered.

The electro-optic device to which the invention is applied can be used for a variety of electronic apparatuses, and in this case, the electronic apparatus is provided with a light source section for irradiating the mirror with the source light. Further, in the case of configuring a projection-type display device as the electronic apparatus, the electronic apparatus is further provided with a projection optical system for projecting the light modulated by the mirror.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
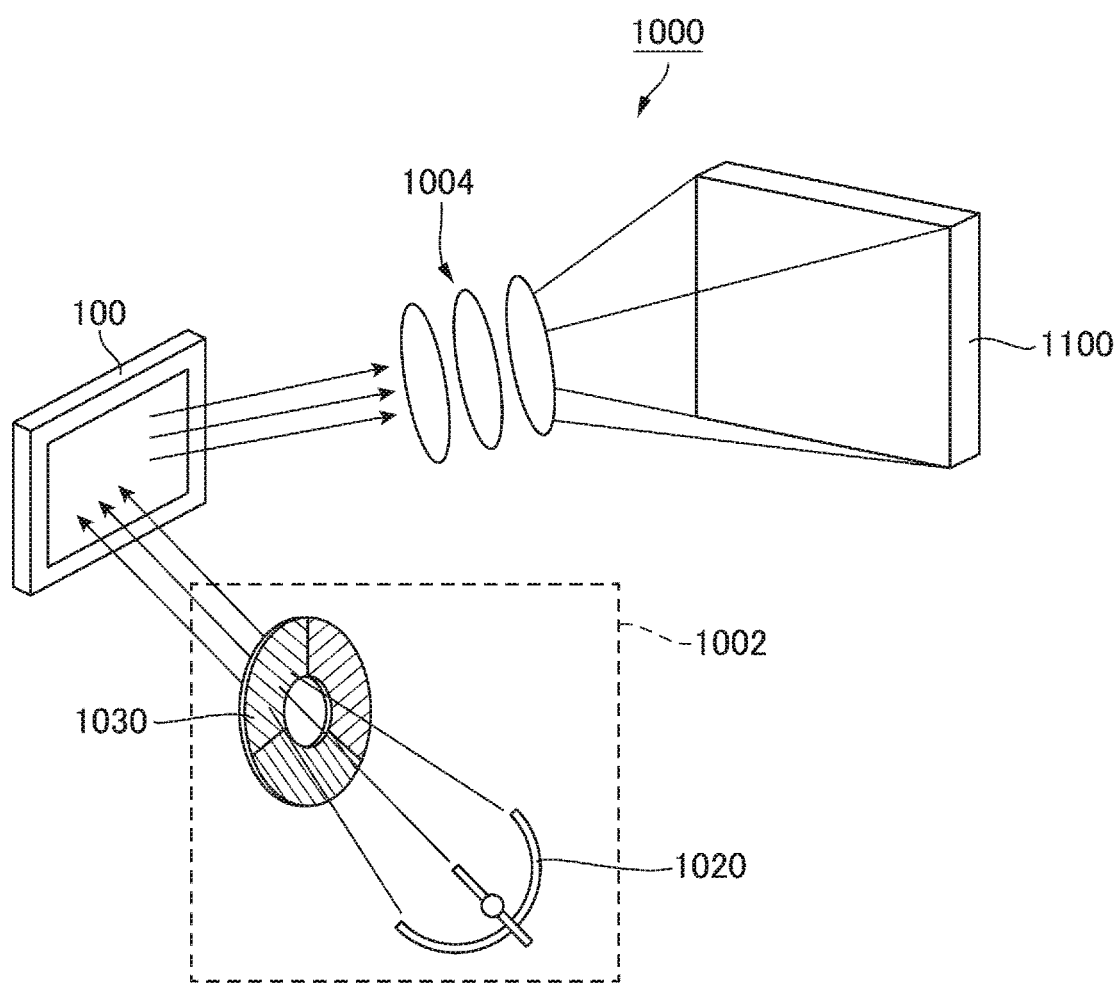
FIG. 1 is an explanatory diagram schematically showing an example of an optical system provided to a projection-type display device to which the invention is applied.

An embodiment of the invention will be described with reference to the accompanying drawings. It should be noted that in the following description, a projection-type display device will be explained as an electronic apparatus to which the invention is applied. Further, in the drawings referred to in the following description, the scale ratios of the layers and the members are made different from each other in order to provide the layers and the members with the sizes in a recognizable range on the drawings. Although the number of the mirrors and so on shown in the drawings is set so as to provide the size in the recognizable range on the drawings, it is also possible to provide a larger number of mirrors than the number of mirrors shown in the drawings.

Projection-Type Display Device as Electronic Apparatus

FIG. 1 is an explanatory diagram schematically showing an example of an optical system provided to the projection-type display device to which the invention is applied. The projection-type display device 1000 (the electronic apparatus) includes a light source section 1002, an electro-optic device 100 for modulating the source light emitted from the light source section 1002 in accordance with image information, and a projection optical system 1004 for projecting the light modulated by the electro-optic device 100 on a projection target 1100 such as a screen to form a projected image. The light source section 1002 is provided with a light source 1020 and a color filter 1030. The light source 1020 emits white light as the source light, the color filter 1030 emits the light of the respective colors due to the rotation, and the electro-optic device 100 modulates the incident light at a timing synchronized with the rotation of the color filter 1030. It should be noted that it is possible to use a phosphor substrate, which converts the light emitted from the light source 1020 into the light with the respective colors, instead of the color filter 1030. Further, it is also possible to provide the light source section 1002 and the electro-optic device 100 for the light with each of the colors.

Basic Configuration of Electro-Optic Device 100

Figure 2:
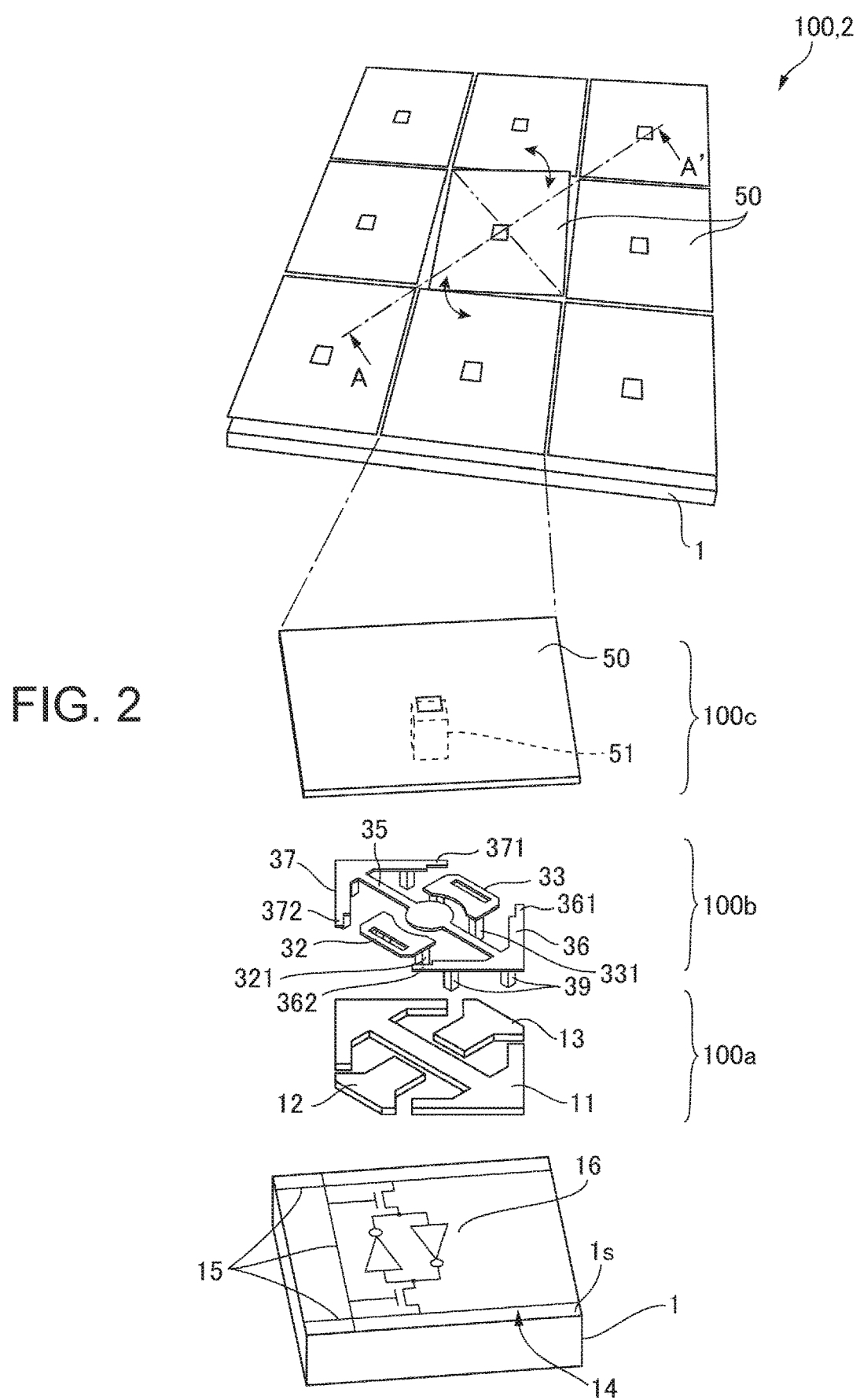
FIG. 2 is an explanatory diagram schematically showing an example of a basic configuration of an electro-optic device to which the invention is applied.
Figure 3:
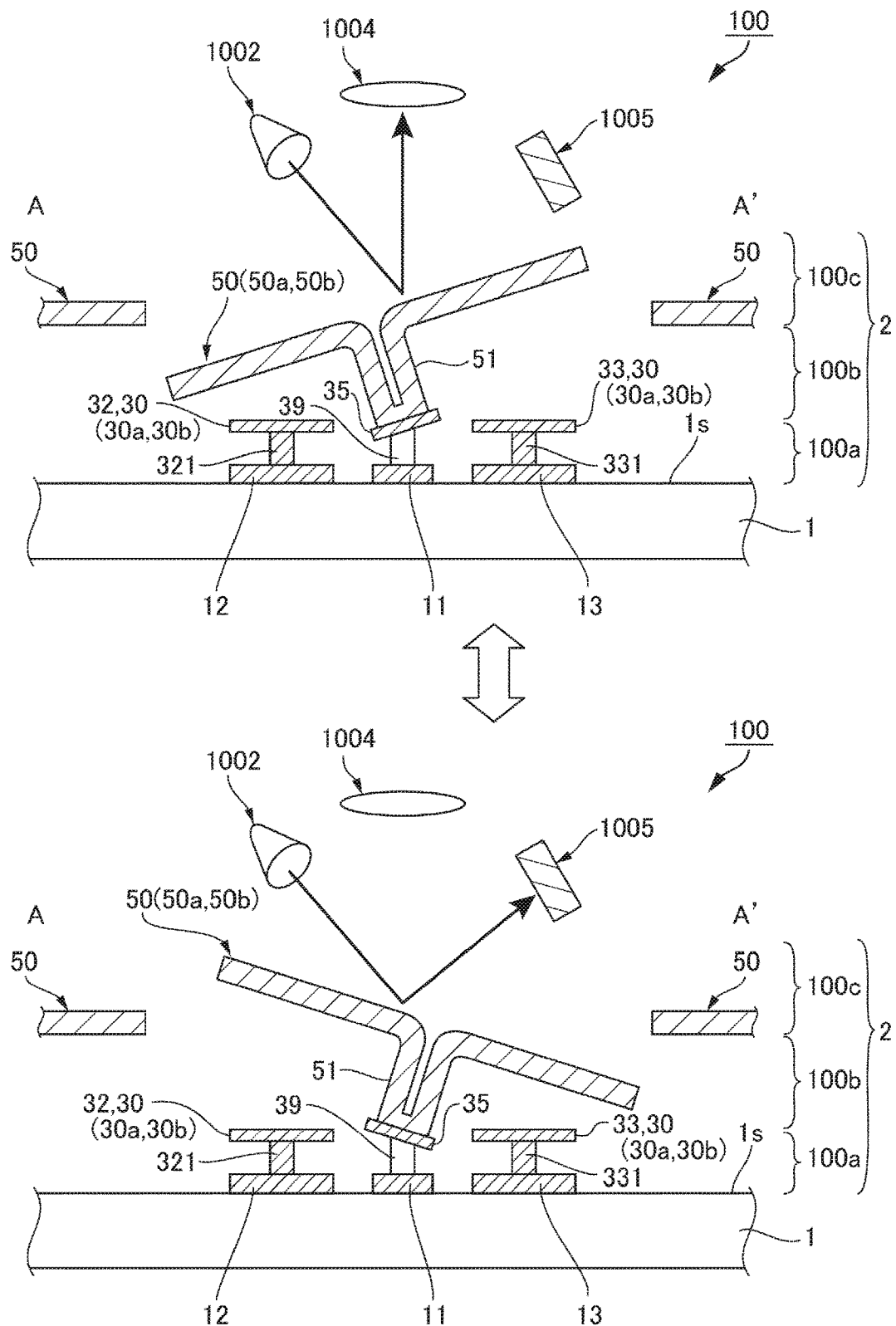
FIG. 3 is an explanatory diagram schematically showing a cross-sectional surface in the periphery of a mirror of the electro-optic device to which the invention is applied.

FIG. 2 is an explanatory diagram schematically showing an example of the basic configuration of the electro-optic device 100 to which the invention is applied, and FIG. 2 also shows a partially exploded condition. FIG. 3 is an explanatory diagram schematically showing a cross-sectional surface in the periphery of a mirror 50 of the electro-optic device 100 to which the invention is applied, and FIG. 3 shows the state in which the mirror 50 is tilted toward one side, and the state in which the mirror 50 is tilted toward the other side.

As shown in FIG. 2 and FIG. 3, the electro-optic device 100 is provided with a chip 2 having a plurality of mirrors 50 arranged in a matrix on one surface is of an element substrate 1, and in the chip 2, the mirrors 50 are separated from the element substrate 1. The element substrate 1 is, for example, a silicon substrate.

The mirrors 50 are each, for example, a micromirror having a planar size of 10 through 30 μm in each side. The mirrors 50 are arranged in, for example, a matrix of 800×600 through 1028×1024, and each of the mirrors 50 corresponds to one pixel of an image.

The surface of each of the mirrors 50 is a reflecting surface formed of a reflecting metal film made of aluminum or the like. The chip 2 is provided with a first layer part 100a including substrate-side bias electrodes 11, substrate-side address electrodes 12, 13, and so on formed on the one surface 1s of the element substrate 1, a second layer part 100b including elevated address electrodes 32, 33 and hinges 35, and a third layer part 100c including the mirrors 50. In the first layer part 100a, the element substrate 1 is provided with an address designation circuit 14. The address designation circuit 14 is provided with memory cells for selectively controlling the operations of the respective mirrors 50, and interconnections 15 of word lines and bit lines, and has a circuit configuration similar to a RAM (random access memory) provided with a CMOS circuit 16.

The second layer part 100b includes the elevated address electrodes 32, 33, the hinges 35, and mirror posts 51. The elevated address electrodes 32, 33 are electrically connected to the substrate-side address electrodes 12, 13 via the electrode posts 321, 331, and at the same time supported by the substrate-side address electrodes 12, 13, respectively. Hinge arms 36, 37 extend respectively from both ends of the hinge 35. The hinge arms 36, 37 are electrically connected to the substrate-side bias electrode 11 via an arm post 39, and at the same time supported by the substrate-side bias electrode 11. The mirror 50 is electrically connected to the hinge 35 via the mirror post 51, and at the same time supported by the hinge 35. Therefore, the mirror 50 is electrically connected to the substrate-side bias electrode 11 via the mirror post 51, the hinge 35, the hinge arms 36, 37, and the arm post 39, and thus, the substrate-side bias electrode 11 applies a bias voltage to the mirror 50. It should be noted that the tips of the hinge arms 36, 37 are respectively provided with stoppers 361, 362 and stoppers 371, 372 for having contact with the mirror 50 to prevent the mirror 50 and the elevated address electrodes 32, 33 from having contact with each other when the mirror 50 is tilted.

The elevated address electrodes 32, 33 constitute a drive element 30 for generating an electrostatic force with the mirror 50 to drive the mirror 50 to tilt. Further, the substrate-side address electrodes 12, 13 are also configured to generate an electrostatic force with the mirror 50 to drive the mirror 50 to tilt in some cases, and in such cases, it results that the drive element 30 is constituted by the elevated address electrodes 32, 33 and the substrate-side address electrodes 12, 13. When the drive voltage is applied to the elevated address electrodes 32, 33, and thus the mirror 50 is tilted so as to be drawn by the elevated address electrode 32 or the elevated address electrode 33, the hinge 35 is twisted, and exerts a force to restore the mirror 50 to the posture parallel to the element substrate 1 when the drive voltage applied to the elevated address electrodes 32, 33 stops to lose the attractive force to the mirror 50.

As shown in FIG. 3, in the electro-optic device 100, for example, when the mirror 50 tilts toward the elevated address electrode 32 on one side, there occurs an ON state in which the light emitted from the light source section 1002 is reflected by the mirror 50 toward the projection optical system 1004. In contrast, when the mirror 50 tilts toward the elevated address electrode 33 on the other side, there occurs an OFF state in which the light emitted from the light source section 1002 is reflected by the mirror 50 toward a light absorption device 1005, and in such an OFF state, no light is reflected toward the projection optical system 1004. Such drive is performed in each of the mirrors 50, and as a result, the light emitted from the light source section 1002 is modulated into image light by the plurality of mirrors 50, and is then projected from the projection optical system 1004 to display an image.

It should be noted that in some cases, a plate-like yoke opposed to the substrate-side address electrodes 12, 13 is disposed integrally with the hinge 35, the mirror 50 is driven using an electrostatic force acting between the substrate-side address electrodes 12, 13 and the yoke in addition to the electrostatic force generated between the elevated address electrodes 32, 33 and the mirror 50.

Sealing Structure of Electro-Optic Device 100

Figure 4:
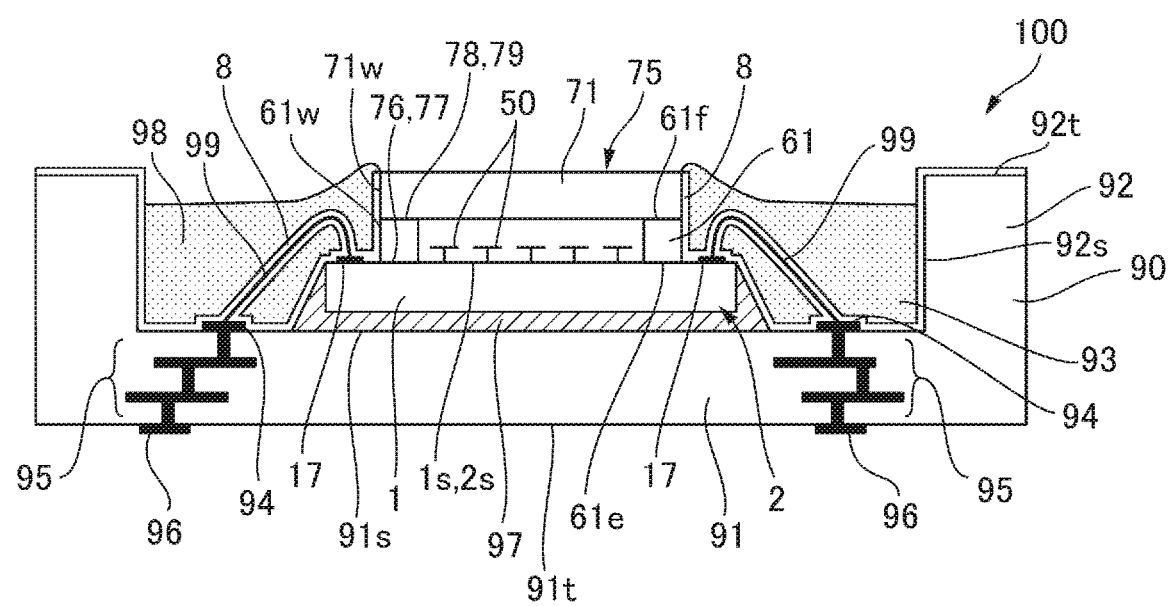
FIG. 4 is an explanatory diagram schematically showing a cross-sectional surface of the whole of the electro-optic device to which the invention is applied.

FIG. 4 is an explanatory diagram schematically showing a cross-sectional surface of the whole of the electro-optic device 100 to which the invention is applied. As shown in FIG. 4, in the electro-optic device 100 according to the present embodiment, the one surface is of the element substrate 1 (the chip 2) provided with the plurality of mirrors 50 described with reference to FIG. 2 and FIG. 3 is sealed with a sealing member 75 formed of a spacer 61 shaped like a frame and a cover 71 shaped like a plate and having a light-transmitting property, then the element substrate 1 (the chip 2) is fixed to a substrate mounting part 93 of an interconnection board 90, and is then sealed with a sealing material 98. In the interconnection board 90, the substrate mounting part 93 is formed as a bottomed recessed part surrounded by a side plate part 92, and the element substrate 1 is fixed to a bottom plate part 91 of the interconnection board 90 with an adhesive layer 97. In such a manner as described above, the mirrors 50 and the chip 2 are protected from moisture and so on.

In the present embodiment, the cover 71 covers the mirrors 50 in a planar view (e.g., a planar view of the surface of the chip 2 on which the mirrors are disposed), and the spacer 61 has contact with one surface 2s of the chip 2 between the cover 71 and the chip 2. More specifically, an end part 61e of the spacer 61 located on the element substrate 1 side is bonded to the one surface 2s of the chip 2 with an adhesive layer 76 made of an epoxy adhesive or the like, and the adhesive layer 76 constitutes a boundary 77 between the spacer 61 and the chip 2. In the present embodiment, the one surface 2s of the chip 2 is formed of the one surface 1s of the element substrate 1.

The cover 71 is bonded to an end part 61f, which is located on the opposite side to the end part opposed to the element substrate 1 of the spacer 61 with an adhesive layer 78 made of an epoxy adhesive or the like, and the adhesive layer 78 constitutes a boundary 79 between the spacer 61 and the cover 71. In this state, the cover 71 is opposed to the surface of each of the mirrors 50 at a position at a predetermined distance from the mirrors 50. Therefore, the light enters the mirror 50 through the cover 71, and then, the light reflected by the mirror 50 is emitted through the cover 71.

In the present embodiment, both of the spacer 61 and the cover 71 each have a quadrangular planar shape, and are equal in external size to each other. Therefore, a side surface 61w of the spacer 61 located on the opposite side to the mirrors 50, and a side surface 71w of the cover 71 constitute a continuous plane. The cover 71 is made of glass. The spacer 61 can also be made of either of glass, silicon, metal, and resin, and in the present embodiment, a glass substrate or a silicon substrate is used as the spacer 61. As the space, which is surrounded by the cover 71 and the spacer 61, and in which the mirrors 50 are disposed, there is adopted a configuration in which air exists, a configuration filled with an inert gas or the like instead of the air, or a configuration set in vacuum. In the present embodiment, the space in which the mirrors 50 are disposed is set in vacuum.

On the one surface is of the element substrate 1, a plurality of chip-side terminals 17 (second terminals) is formed in an end part (outer side of the spacer 61) not overlapping the mirrors 50. In the present embodiment, the chip-side terminals 17 are arranged in two lines so as to sandwich the mirrors 50. Some of the chip-side terminals 17 are electrically connected to the elevated address electrodes 32, 33 (the drive element 30) via the address designation circuit 14 and the substrate-side address electrodes 12, 13 described with reference to FIG. 2 and FIG. 3. Some of the rest of the chip-side terminals 17 are electrically connected to the mirrors 50 via the address designation circuit 14, the substrate-side bias electrodes 11, and the hinges 35 described with reference to FIG. 2 and FIG. 3. Some of other rest of the chip-side terminals 17 are electrically connected to the drive circuit and so on disposed in an anterior stage of the address designation circuit 14 described with reference to FIG. 2 and FIG. 3.

The chip-side terminals 17 are in an open state on an opposite side to the element substrate 1. Further, the interconnection board 90 is provided with internal terminals 94 (first terminals) disposed on a surface (one surface 91s) of the bottom part 91 located on the element substrate 1 side, and the chip-side terminals 17 and the internal terminals 94 are electrically connected to each other with conductive members 99 each formed of a wire for wire bonding or the like. The bottom plate part 91 of the interconnection board 90 forms a multilayer interconnection board, and the internal terminals 94 are electrically connected to external terminals 96 formed on an outer surface 91t of the bottom plate part 91 located on the opposite side to the element substrate 1 via the multilayer interconnection parts 95 each formed of through holes and interconnections provided to the bottom plate part 91.

In the inside of the side plate part 92 (the recessed part) of the interconnection board 90, there is disposed a sealing material 98 made of resin such as epoxy resin. The sealing material 98 covers the conductive members 99, bond parts between the conductive members 99 and the chip-side terminals 17, bond parts between the conductive members 99 and the internal terminals 94, the periphery of the element substrate 1, the boundary 77 (the adhesive layer 76) between the spacer 61 and the element substrate 1, and the periphery of the boundary 79 (the adhesive layer 78) between the spacer 61 and the cover 71, and at the same time covers the entire side surface 61w of the spacer 61 and the entire side surface 71w of the cover 71.

Configuration of Inorganic Film 8 for Sealing

In the electro-optic device 100 according to the present embodiment, the inorganic film 8 is formed on the side surface 61w of the spacer 61 and the side surface 71w of the cover 71, and the sealing material 98 covers the side surface 61w of the spacer 61 and the side surface 71w of the cover 71 via the inorganic film 8. The inorganic film 8 continues from the side surface 71w of the cover 71 to the one surface 2s (the one surface is of the element substrate 1) of the chip 2 via the side surface 61w of the spacer 61. Therefore, the inorganic film 8 covers the boundary 79 between the spacer 61 and the cover 71 and the boundary 77 between the spacer 61 and the chip 2, and the sealing material 98 covers the boundaries 77, 79 via the inorganic film 8.

In the present embodiment, the inorganic film 8 covers the conductive members 99 each formed of the wire. Further, the inorganic film 8 continues to a tip surface 92t of the side plate part 92 via the one surface 2s of the chip 2, the surface of the adhesive layer 97, the one surface 91s of the bottom plate part 91 of the interconnection board 90, and an inner surface 92s of the side plate part 92. Therefore, the inorganic film 8 covers the part (a part) except the parts to which the conductive members 99 are respectively bonded in the chip-side terminals 17, and at the same time covers the part (a part) except the parts to which the conductive members 99 are respectively bonded in the internal terminals 94. Therefore, the sealing material 98 covers the conductive member 99, a part of each of the chip-side terminals 17, and a part of each of the internal terminals 94 via the inorganic film 8.

In the present embodiment, the inorganic film 8 is formed of a single-layer film or a multilayer film of an oxide film such as a silicon oxide film, aluminum oxide film, a tantalum oxide film, a titanium oxide film, a niobium oxide film, or a hafnium oxide film, or a nitride film such as a silicon nitride film, an aluminum nitride film, a tantalum nitride film, a titanium nitride film, a niobium nitride film, or a hafnium nitride film.

Method of Manufacturing Electro-optic Device 100

Figure 5:
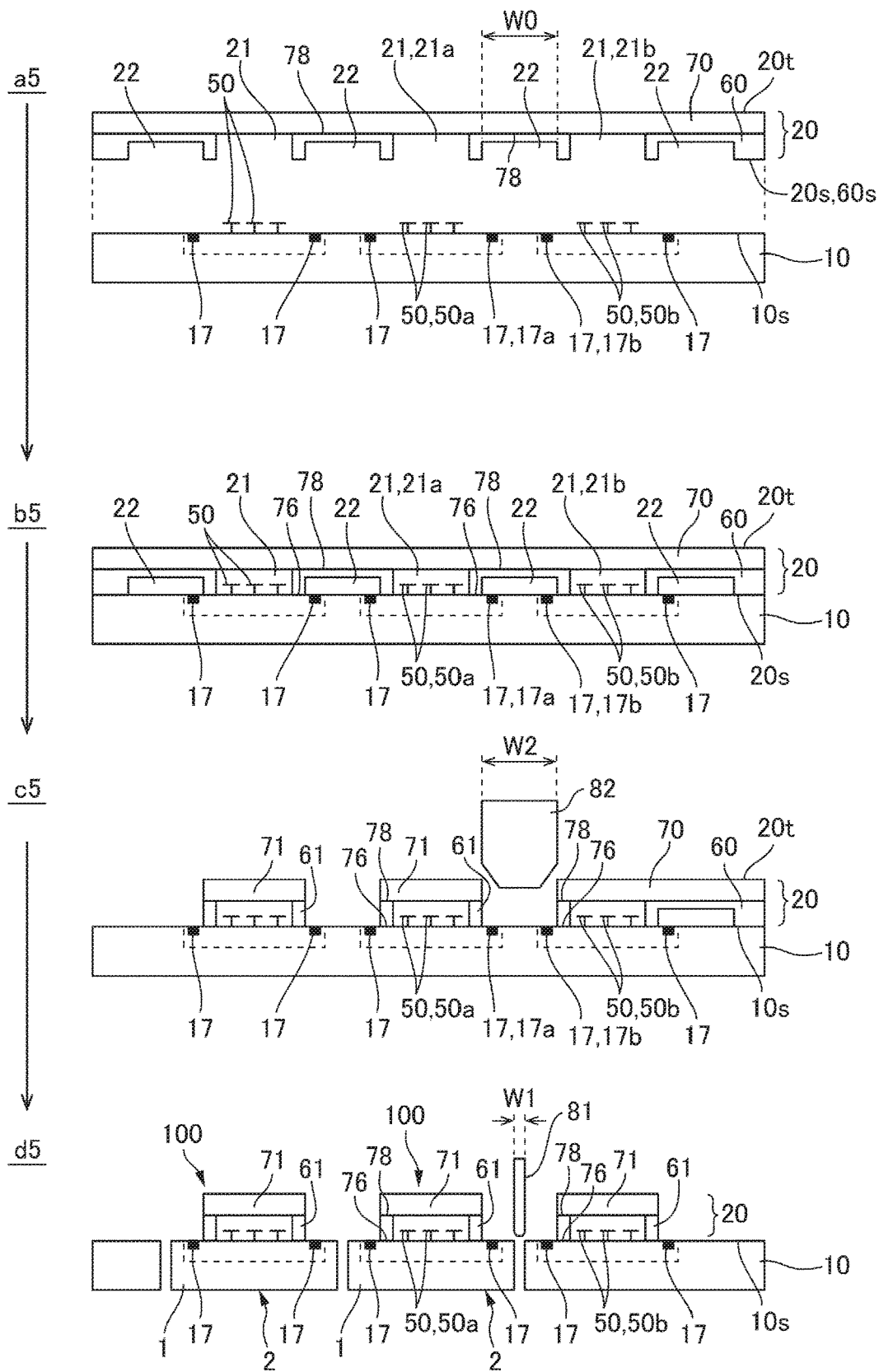
FIG. 5 is a process cross-sectional view showing a method of manufacturing the electro-optic device to which the invention is applied.
Figure 6:
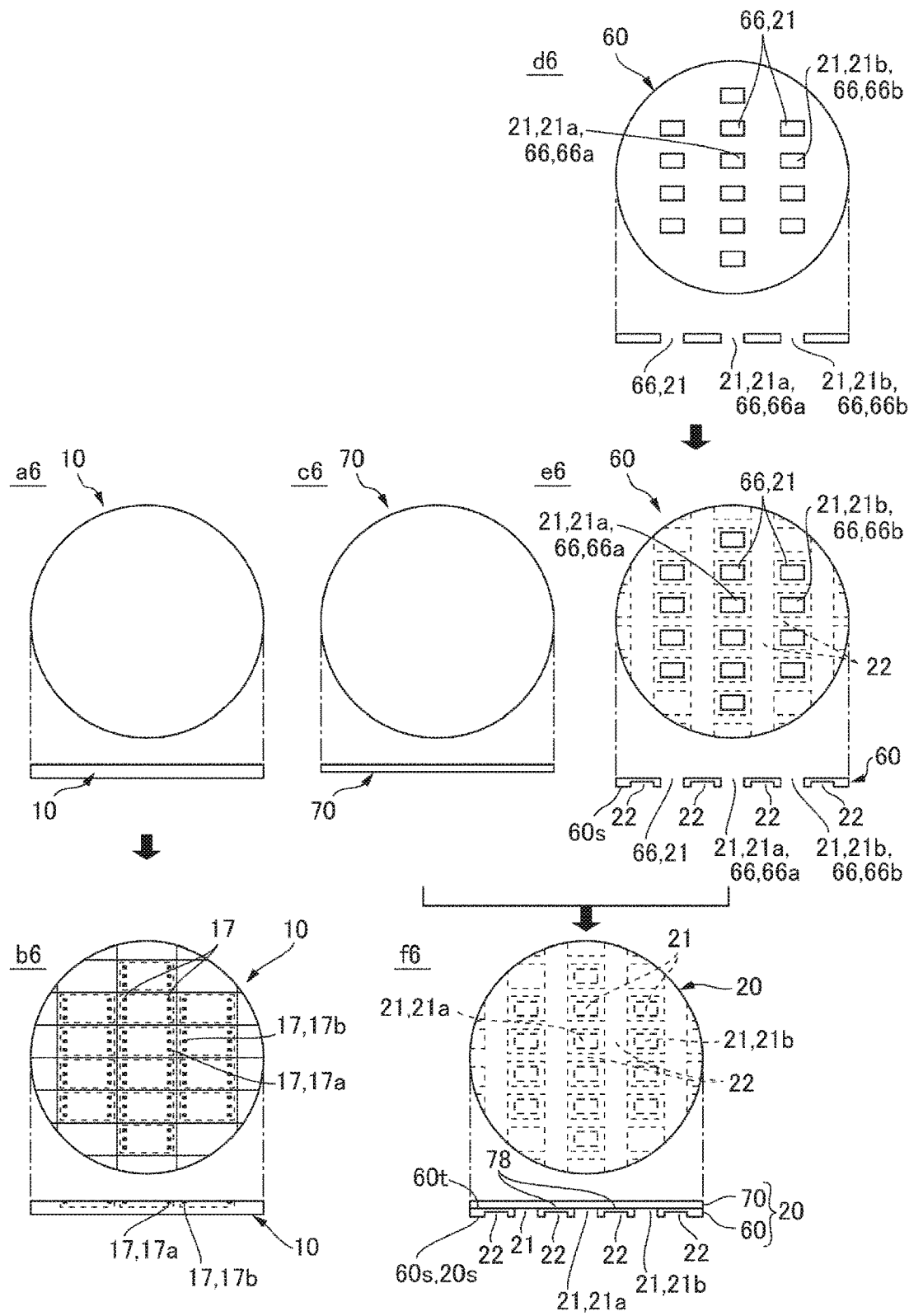
FIG. 6 is a process chart showing a method of manufacturing a second wafer and so on used for the manufacture of the electro-optic device to which the invention is applied.
Figure 7:
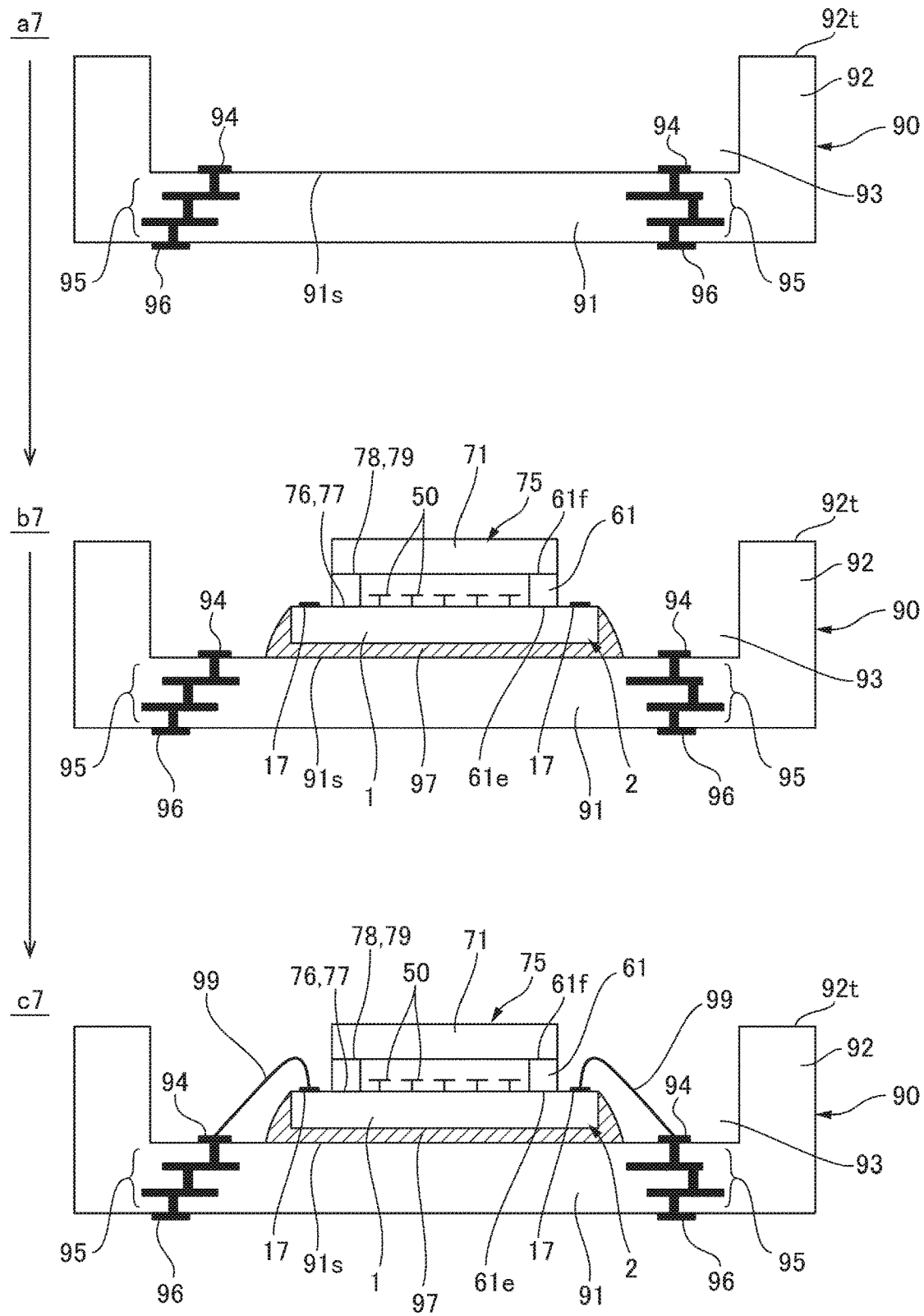
FIG. 7 is a process cross-sectional view showing a process of installing a chip and so on on an interconnection board in the method of manufacturing the electro-optic device to which the invention is applied.
Figure 8:
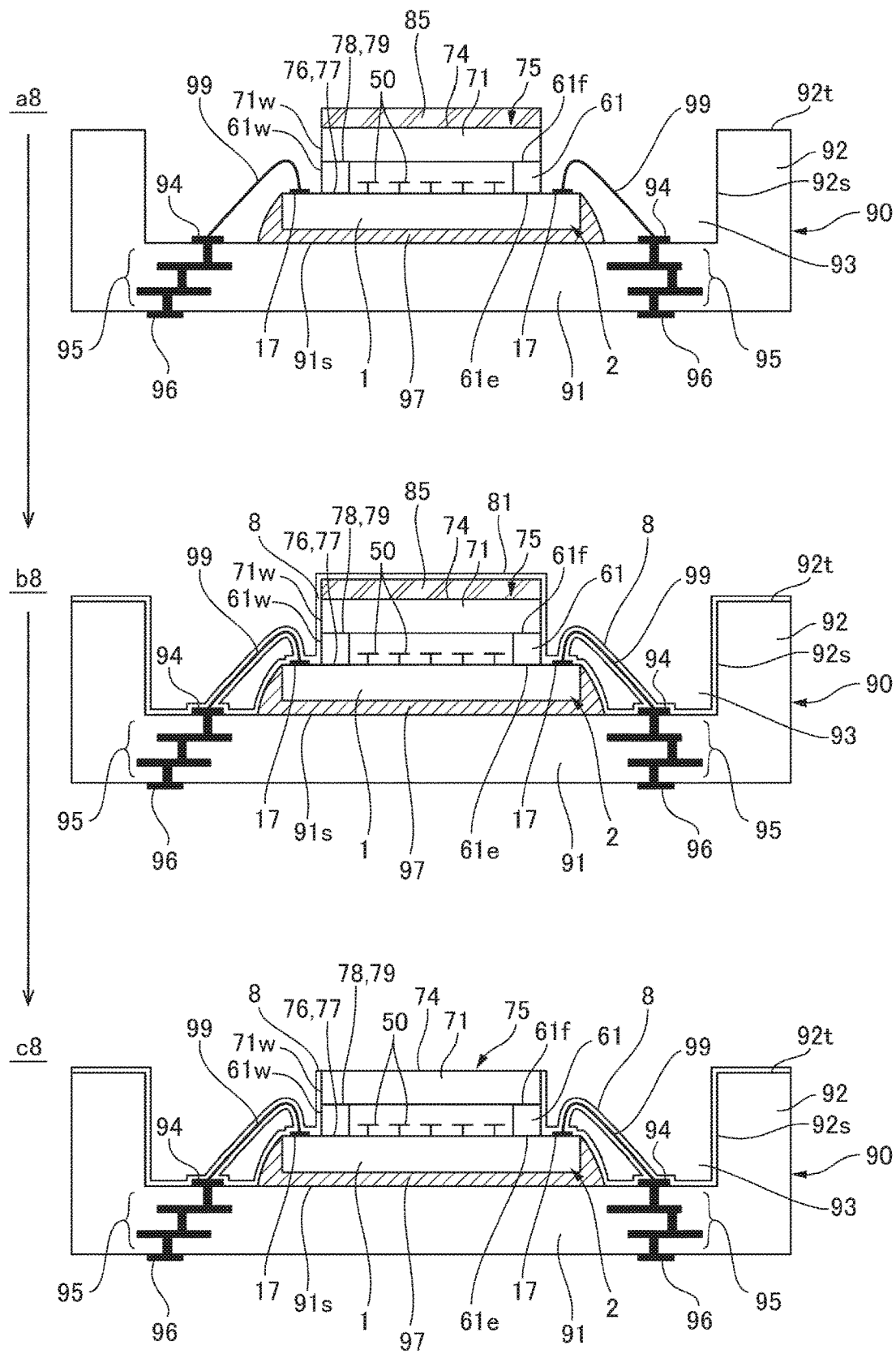
FIG. 8 is a process cross-sectional view showing a method of forming an inorganic film for sealing the chip in the method of manufacturing the electro-optic device to which the invention is applied.

A method of manufacturing the electro-optic device 100 to which the invention is applied will be described with reference to FIG. 5, FIG. 6, FIG. 7, and FIG. 8. FIG. 5 is a process cross-sectional view showing the method of manufacturing the electro-optic device 100 to which the invention is applied. FIG. 6 is a process chart showing a manufacturing method of a second wafer 20 and so on used in the manufacture of the electro-optic device 100 to which the invention is applied, and FIG. 6 shows a plan view of the wafer in each process, and at the same time shows a cross-sectional view below the plan view. FIG. 7 is a process cross-sectional view showing a process of installing a chip 2 and so on on an interconnection board 90 in the method of manufacturing the electro-optic device 100 to which the invention is applied. FIG. 8 is a process cross-sectional view showing a method of forming the inorganic film 8 for sealing the chip 2 in the method of manufacturing the electro-optic device 100 to which the invention is applied. It should be noted that illustration of the mirrors 50 and so on is omitted in FIG. 6, and in FIG. 5, it is assumed that the number of mirrors 50 is decreased compared to FIG. 4, FIG. 7, and FIG. 8, and three mirrors 50 are provided to one element substrate 1.

In the present embodiment, a plurality of element substrates 1 and so on are obtained from an wafer with multi-piece processing. Therefore, in the following description, among the plurality of element substrates 1 obtained with the multi-piece processing, the mirrors 50 and the chip-side terminals 17 formed in an area where one substrate is obtained are described attaching "a" to the back of each of the reference symbols like "first mirrors 50a" and "first chip-side terminals 17a." Further, among the plurality of element substrates 1, the mirrors 50 and the chip-side terminals 17, which are formed in an area adjacent to the area where the first mirrors 50a and the first chip-side terminals 17a are formed, are described attaching "b" to the back of each of the reference symbols like "second mirrors 50b" and "second chip-side terminals 17b." It should be noted that in the case in which there is no need to specify which element substrate 1 is mentioned, the description will be presented without attaching "a" or "b" described above.

In order to manufacture the electro-optic device 100 according to the present embodiment, a first wafer 10, which is large in size, and with which the multi-piece processing of the element substrates 1 can be realized, is prepared in the process a5 shown in FIG. 5 and the processes a6, b6 (first wafer preparatory process) shown in FIG. 6. On one surface 10s (first surface) of the first wafer, the mirrors 50, the chip-side terminals 17, and the drive element 30 (not shown) are formed in each of the areas which are divided to obtain the element substrates 1.

Therefore, on the one surface 10s of the first wafer 10, the first mirrors 50a are formed, and at the same time, the first chip-side terminals 17a electrically connected to the first drive element 30a (see FIG. 2 and FIG. 3) for driving the first mirrors 50a are formed at positions adjacent to the first mirrors 50a in a planar view. Further, on the one surface 10s of the first wafer 10, there are formed the second mirrors 50b on the opposite side to the first mirrors 50a with respect to the first chip-side terminals 17a, and at the same time, there are formed the second chip-side terminals 17b electrically connected to the second drive element 30b (see FIG. 2 and FIG. 3) for driving the second mirrors 50b between the first chip-side terminals 17a and the second mirrors 50b.

Further, in the process a5 (a second wafer forming process) shown in FIG. 5, there is prepared a second wafer 20, which is large in size, and with which the multi-piece processing of the spacers 61 and the covers 71 can be realized. On a second surface 20s formed of one surface of the second wafer 20, a recessed part 21, the bottom part of which has a light-transmitting property, is formed in each of the areas which are divided to obtain the spacers 61 and the covers 71, and at the same time, there are formed grooves 22 each having a bottom and extending in two directions perpendicular to each other to surround each of the recessed parts 21. One of the recessed parts 21 corresponds to a first recessed part 21a, and the recessed part 21 adjacent to the first recessed part 21a corresponds to a second recessed part 21b. Therefore, on the second surface 20s of the second wafer 20, there are formed the first recessed part 21a, the bottom part of which has a light-transmitting property, the second recessed part 21b, the bottom part of which has a light-transmitting property, and the grooves 22 each having a bottom and extending along the space between the first recessed part 21a and the second recessed part 21b.

When forming such a second wafer 20, in the second wafer forming process, for example, the processes c6 through f6 shown in FIG. 6 are performed. Firstly, in the process c6, there is prepared a light-transmitting wafer 70 (a fourth wafer), with which the multi-piece processing of the covers 71 can be realized. Further, in the process d6, a wafer-for-spacers 60 (a third wafer) with which the multi-piece processing of the spacers 61 can be realized is prepared, and then, in the first process, through holes 66 for forming the recessed parts 21 are formed in the wafer-for-spacers 60 using a process such as etching. One of the through holes 66 corresponds to a first through hole 66a for forming the first recessed part 21a, and the through hole 66 adjacent to the first through hole 66a corresponds to a second through hole 66b for forming the second recessed part 21b. Then, in the process e6, the grooves 22 each having a bottom and extending in the two directions perpendicular to each other to surround each of the recessed parts 21 are formed using a process such as half etching. It should be noted that although in the first process, the through holes 66 are formed and then the grooves 22 are formed, it is also possible to form the grooves 22 and then form the through holes 66.

Then, in the second process, as shown in the process f6, the light-transmitting wafer 70 is stacked on a surface 60t of the wafer-for-spacers 60 located on the opposite side to a surface 60s on which the grooves 22 open, and bonded to the surface 60t with the adhesive layer 78. As a result, the second wafer 20 having the wafer-for-spacers 60 and the light-transmitting wafer 70 stacked on one another is formed, and in such a second wafer 20, the surface 60s of the wafer-for-spacers 60 forms the second surface 20s of the second wafer 20, and the surface of the light-transmitting wafer 70 located on the opposite side to the wafer-for-spacers 60 forms a third surface 20t of the second wafer 20. Further, one opening ends of the through holes 66 (the first through hole 66a and the second through hole 66b) are blocked by the light-transmitting wafer 70 to form the recessed parts 21 (the first recessed part 21a and the second recessed part 21b), the bottom parts of which have a light-transmitting property.

Then, in the bonding process, in the process b5 shown in FIG. 5, the one surface 10s of the first wafer 10 and the second surface 20s of the second wafer 20 are bonded to each other with the adhesive layer 76 so that the recessed parts 21 overlap the mirrors 50 in a planar view (e.g., the planar view when viewing the first wafer 10 from the one surface 10s side), and the grooves 22 overlap the chip-side terminals 17. As a result, the first recessed part 21a overlaps the first mirrors 50a in the planar view, the second recessed part 21b overlaps the second mirrors 50b in the planar view, the common groove 22 overlaps the first chip-side terminals 17a, the second chip-side terminals 17b, and an area sandwiched by the first chip-side terminals 17a and the second chip-side terminals 17b in the planar view. In this state, the part sandwiched by the first recessed part 21a and the groove 22 in the second wafer 20 is bonded to the area between the first mirrors 50a and the first chip-side terminals 17a, and the part sandwiched by the second recessed part 21b and the groove 22 in the second wafer 20 is bonded to the area between the second mirrors 50b and the second chip-side terminals 17b. Therefore, the first chip-side terminals 17a and the second chip-side terminals 17b are not bonded to the second wafer 20.

Then, in the process c5 (a second wafer dicing process) shown in FIG. 5, a dicing blade-for-second wafer 82 (a first dicing blade) is made to approach from the third surface 20t, which is formed of a surface of the second wafer 20 located on the opposite side to the second surface 20s, to dice the second wafer 20 along the grooves 22. As a result, the second wafer 20 is divided, and out of the second wafer 20, the cover 71 is constituted by a plate part obtained by dividing the light-transmitting wafer 70, and the spacer 61 is constituted by a frame part obtained by dividing the wafer-for-spacers 60. In the present embodiment, the thickness W2 of the dicing blade-for-second wafer 82 is equivalent to the width W0 of the grooves 22.

Then, in the process d5 (a first wafer dicing process) shown in FIG. 5, the first wafer 10 is diced along the areas (the areas sandwiched by the first chip-side terminals 17a and the second chip-side terminals 17b), where the first wafer 10 is divided to obtain the element substrates 1, using a dicing blade-for-first wafer 81 (a second dicing blade). As a result, the first wafer 10 is diced in the areas between the first chip-side terminals 17a and the second chip-side terminals 17b. In the present embodiment, the thickness W1 of the dicing blade-for-first wafer 81 is thinner than the thickness W2 of the dicing blade-for-second wafer 82. Therefore, in the first wafer dicing process, the dicing blade-for-first wafer 81 is made to approach the cut place (an area between the covers 71 adjacent to each other, and an area between the spacers 61 adjacent to each other) of the second wafer 20 from the second wafer 20 side with respect to the first wafer 10 to dice the first wafer 10.

As a result, there is manufactured a plurality of electro-optic devices 100 each having the element substrate 1, which is provided with the mirrors 50 formed on the one surface is, and the one surface is of which is sealed with the spacer 61 and the cover 71. In the present embodiment, the electro-optic device 100 is further sealed with the interconnection board 90, the inorganic film 8, and the sealing material 98 as shown in FIG. 4.

Firstly, in the process a7 shown in FIG. 7, the interconnection board 90 having the substrate mounting part 93 formed as the recessed part surrounded by the side plate part 92 is prepared, and then in the process b7 (a chip installation process) shown in FIG. 7, the chip 2 (the element substrate 1) is fixed to the bottom part of the substrate mounting part 93 with the adhesive layer 97. As a result, on the one surface 91s of the interconnection board 90, there are disposed the chip 2 provided with the mirrors 50 and the drive element 30 (see FIG. 3), the cover 71 covering the mirrors 50 in the planar view, and the spacer 61 located between the cover 71 and the chip 2.

Then, in the process c7 (a connection process) shown in FIG. 7, the chip-side terminals 17 on the element substrate 1 and the internal terminals 94 on the interconnection board 90 are electrically connected to each other with the conductive members 99.

Then, in an inorganic film forming process shown in FIG. 8, there is formed the inorganic film 8 covering the boundary 79 between the cover 71 and the spacer 61 and the boundary 77 between the spacer 61 and the chip 2. In the present embodiment, the inorganic film 8 is deposited so as to cover the cover 71 in the process b8 (a deposition process) shown in FIG. 8, and then the inorganic film 8 overlapping the outer surface 74 as a surface of the cover 71 located on the opposite side to the mirrors 50 is removed in the process c8 (an inorganic film removal process) shown in FIG. 8. When performing such an inorganic film removal process, a protective member 85 shaped like a tape is disposed on the outer surface 74 of the cover 71 in the process a8 shown in FIG. 8, and the inorganic film 8 is deposited in a state in which the outer surface 74 of the cover 71 is covered with the protective member 85 in the process b8 (the deposition process) shown in FIG. 8. Further, in the process c8 (the inorganic film removal process) shown in FIG. 8, the protective member 85 is removed from the outer surface 74 of the cover 71 to remove the inorganic film 8 covering the protective member 85. Therefore, the inorganic film 8 overlapping the outer surface 74 of the cover 71 can easily be removed.

In the present embodiment, at the moment when the inorganic film forming process shown in FIG. 8 is completed, the inorganic film 8 covers the conductive members 99 each formed of the wire. Further, the inorganic film 8 covers the part (a part) except the parts to which the conductive members 99 are respectively bonded in the chip-side terminals 17, and at the same time covers the part (a part) except the parts to which the conductive members 99 are respectively bonded in the internal terminals 94. Further, the inorganic film 8 covers the one surface 91s of the bottom plate part 91 of the interconnection board 90, the inner surface 92s of the side plate part 92, and the tip surface 92t.

In the process b8 (the deposition process) shown in FIG. 8, the inorganic film 8 is deposited using an atomic layer deposition (ALD) method, a chemical vapor deposition (CVD) method, or the like. For example, using the atomic layer deposition method, as the inorganic film 8, there is formed a single-layer film or a multilayer film of an oxide film such as a silicon oxide film, aluminum oxide film, a tantalum oxide film, a titanium oxide film, a niobium oxide film, or a hafnium oxide film, or a nitride film such as a silicon nitride film, an aluminum nitride film, a tantalum nitride film, a titanium nitride film, a niobium nitride film, or a hafnium nitride film. According to the atomic layer deposition method, since this method is superior in coatability for an uneven shape, the boundary 77 between the cover 71 and the spacer 61 and the boundary 79 between the chip 2 and the spacer 61 can reliably be covered with the inorganic film 8. In the present embodiment, the inorganic film 8 is an aluminum oxide film, and is an insulation film.

Subsequently, as shown in FIG. 4, the sealing material 98 is poured inside the side plate part 92 of the interconnection board 90, and then the sealing material 98 is made to cure to seal the element substrate 1 with the sealing material 98. As a result, it is possible to obtain the electro-optic device 100 having the mirrors 50 sealed with the spacer 61, the cover 71, the interconnection board 90, the inorganic film 8, and the sealing material 98.

Major Advantages of Present Embodiment

As described hereinabove, in the electro-optic device 100 according to the present embodiment and the method of manufacturing the electro-optic device 100, the boundary 79 between the light-transmitting cover 71 and the spacer 61, and the boundary 77 between the chip 2 and the spacer 61 are covered with the inorganic film 8, and the inorganic film 8 is formed via the deposition process to the cover 71, the spacer 61, and the chip 2. Therefore, the inorganic film 8 is high in adhesiveness with the cover 71, the spacer 61, and the chip 2. Therefore, since it is difficult for moisture to infiltrate between the inorganic film 8 and the cover 71, it is possible to effectively prevent the moisture from infiltrating in the space, in which the mirrors 50 are disposed, through the boundary 79 between the cover 71 and the spacer 61 and the boundary 77 between the chip 2 and the spacer 61. Therefore, it is hard for the failure that, for example, the mirror 50 is stuck in a tilted posture due to the moisture attached to the periphery of the mirror 50 to occur.

Further, in the present embodiment, the inorganic film 8 covers the conductive members 99, and the inorganic film 8 functions as a protective film for the conductive member 99. Therefore, it is possible to prevent the conductive members 99 from being broken due to the pressure applied when disposing the sealing material 98. Further, since the inorganic film 8 is an insulating film, short circuit between the conductive members 99 and so on can be prevented.

Further, since the adhesive layers 76, 78 disposed on the boundary 77 between the chip 2 and the spacer 61 and the boundary 79 between the cover 71 having the light-transmitting property and the spacer 61 include an OH group such as an epoxy adhesive, the chemical reaction due to the atomic layer deposition method promptly progresses on the adhesive layers, and the adhesiveness between the adhesive layers and the inorganic film is improved. Therefore, it is possible to suppress deterioration of the mirrors 50.

Another Method of Manufacturing Electro-optic Device 100

Figure 9:
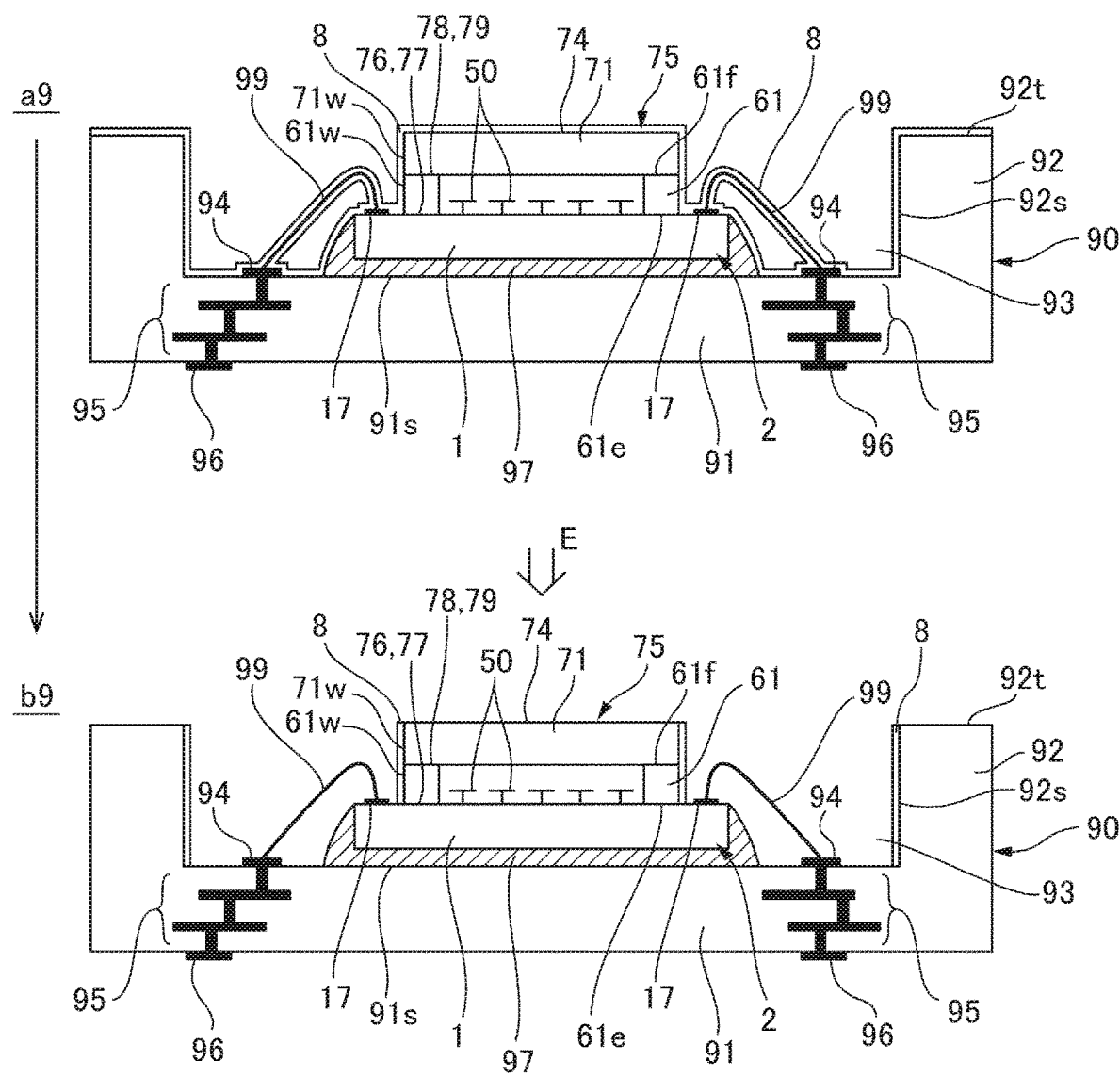
FIG. 9 is a process cross-sectional view showing a method of forming the inorganic film for sealing the chip in another method of manufacturing the electro-optic device to which the invention is applied.

FIG. 9 is a process cross-sectional view showing a method of forming the inorganic film 8 for sealing the chip 2 in another method of manufacturing the electro-optic device 100 to which the invention is applied.

Also in the present embodiment, the chip 2 provided with the mirrors 50 and the drive element 30 (see FIG. 3), the cover 71 covering the mirrors 50 in the planar view, and the spacer 61 located between the cover 71 and the chip 2 are disposed on the one surface 91s of the interconnection board 90 in the process b7 (the chip installation process) referring to FIG. 7. Then, in an inorganic film forming process shown in FIG. 9, there is formed the inorganic film 8 covering the boundary 79 between the cover 71 and the spacer 61 and the boundary 77 between the spacer 61 and the chip 2.

In the present embodiment, the inorganic film 8 is deposited so as to cover the cover 71 in the process a9 (a deposition process) shown in FIG. 9, and then the inorganic film 8 overlapping the outer surface 74 of the cover 71 located on the opposite side to the mirrors 50 is removed in the process b9 (an inorganic film removal process) shown in FIG. 9. In performing such an inorganic film removal process, in the present embodiment, there is performed anisotropic etching having etch directionality in a direction perpendicular to the outer surface 74 of the cover 71 as indicated by the arrow E to thereby remove the inorganic film 8 overlapping the outer surface 74 of the cover 71. As a result, there is formed the inorganic film 8 covering the boundary 79 between the cover 71 and the spacer 61 and the boundary 77 between the spacer 61 and the chip 2. It should be noted that the inorganic film 8 covering the conductive members 99, the chip-side terminals 17, and the internal terminals 94, and the inorganic film 8 covering the bottom plate part 91 of the interconnection board 90 and the tip surface 92t of the side plate part 92 are removed in the inorganic film removal process, and in the interconnection board 90, only the inner surface 92s of the side plate part 92 is covered with the inorganic film 8.

Subsequently, as shown in FIG. 4, the sealing material 98 is poured inside the side plate part 92 of the interconnection board 90, and then the sealing material 98 is made to cure to seal the element substrate 1 with the sealing material 98. As a result, it is possible to obtain the electro-optic device 100 having the mirrors 50 sealed with the spacer 61, the cover 71, the interconnection board 90, the inorganic film 8, and the sealing material 98.

According also to such a manufacturing method, since the inorganic film 8 is high in adhesiveness with the cover 71, the spacer 61, and the chip 2, it is difficult for moisture to infiltrate from between the inorganic film 8 and the cover 71. Therefore, it is possible to effectively prevent the moisture from infiltrating in the space, in which the mirrors 50 are disposed, through the boundary 79 between the cover 71 and the spacer 61 and the boundary 77 between the chip 2 and the spacer 61. Therefore, there is obtained the advantage that it is hard for the failure that, for example, the mirror 50 is stuck in a tilted posture due to the moisture attached to the periphery of the mirror 50 to occur.

Another Embodiment

In the embodiment described above, the internal terminals 94 (the first terminals) and the chip-side terminals 17 (the second terminals) are electrically connected to each other with wires for wire bonding. However, the invention can be applied to the case in which the chip 2 has a surface mount structure. In this case, the internal terminals 94 (the first terminals) and the chip-side terminals 17 (the second terminals) are disposed at the positions overlapping the chip 2, and therefore have no chance to be covered with the inorganic film 8.

What is claimed is:

1. An electro-optic device comprising:
an interconnection board;
a chip mounted on one surface of the interconnection board in a recess, and provided with a mirror and a drive element configured to drive the mirror;
a cover having a light-transmitting property, and configured to cover the mirror;
a spacer located between the cover and the chip;
an inorganic film comprising a first material disposed within the recess to cover a boundary between the cover and the spacer, a boundary between the chip and the spacer, and a part of the one surface of the interconnection board; and
a sealing material comprising a second material disposed within the recess covering the inorganic film at the boundary between the spacer and the cover, covering the inorganic film at the boundary between the chip and the spacer, and covering the inorganic film at the part of the one surface of the interconnection board,
wherein the second material is different than the first material.

2. The electro-optic device according to claim 1, further comprising:
a first terminal disposed on the one surface of the interconnection board;
a second terminal electrically connected to the drive element, and provided to the chip; and
a conductive member configured to connect the first terminal and the second terminal to each other,
wherein the inorganic film is an insulating film, and covers the conductive member.

3. The electro-optic device according to claim 2, wherein the inorganic film covers a part of the first terminal.

4. The electro-optic device according to claim 1, further comprising:
an adhesive layer made of an adhesive including an OH group disposed on the boundary between the spacer and the cover.

5. A method of manufacturing an electro-optic device, comprising:
disposing a chip provided with a mirror and a drive element configured to drive the mirror on one surface of an interconnection board in a recess, a cover configured to cover the mirror, and a spacer located between the cover and the chip;
forming an inorganic film comprising a first material an configured to cover a boundary between the cover and the spacer, and a boundary between the spacer and the chip after disposing the chip; and
disposing, after forming the inorganic film, a sealing material comprising a second material within the recess covering the inorganic film at the boundary between the spacer and the cover, and covering the organic film at the boundary between the chip and the spacer,
wherein the second material is different than the first material.

6. The method of manufacturing the electro-optic device according to claim 5, wherein
the interconnection board has a first terminal on the one surface,
the chip has a second terminal electrically connected to the drive element, and
the inorganic film is an insulating film,
and further comprising:
connecting the first terminal and the second terminal to each other with a conductive member after disposing the chip and before forming the inorganic film.

7. The method of manufacturing the electro-optic device according to claim 6, wherein
after forming the inorganic film, the inorganic film covers the conductive member.

8. The method of manufacturing the electro-optic device according to claim 6, wherein
after forming the inorganic film, the inorganic film covers a part of the first terminal.

9. The method of manufacturing the electro-optic device according to claim 5, wherein
the forming of the inorganic film includes
depositing the inorganic film so as to cover the cover, and
removing the inorganic film overlapping an outer surface of the cover as a surface located on an opposite side to the mirror after depositing the inorganic film.

10. The method of manufacturing the electro-optic device according to claim 9, wherein
in depositing the inorganic film, the inorganic film is deposited in a state of covering the outer surface with a protective member, and
in removing the inorganic film, the protective member is removed from the outer surface.

11. The method of manufacturing the electro-optic device according to claim 5, wherein
in forming the inorganic film, the inorganic film is deposited using an atomic layer deposition method.

12. An electronic apparatus comprising:
the electro-optic device according to claim 1; and
a light source section configured to irradiate the mirror with source light.

* * * * *